(12) United States Patent
Kamata et al.

(10) Patent No.: US 11,955,772 B2
(45) Date of Patent: Apr. 9, 2024

(54) SEMICONDUCTOR LIGHT EMITTING ELEMENT

(71) Applicants: DENSO CORPORATION, Kariya (JP); KYUSHU UNIVERSITY, NATIONAL UNIVERSITY CORPORATION, Fukuoka (JP)

(72) Inventors: Yuki Kamata, Kariya (JP); Koichi Oyama, Kariya (JP); Hiroyuki Tarumi, Kariya (JP); Kiichi Hamamoto, Fukuoka (JP); Haisong Jiang, Fukuoka (JP)

(73) Assignees: DENSO CORPORATION, Kariya (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 380 days.

(21) Appl. No.: 17/210,939

(22) Filed: Mar. 24, 2021

(65) Prior Publication Data
US 2021/0305779 A1  Sep. 30, 2021

(30) Foreign Application Priority Data
Mar. 27, 2020  (JP) .................................. 2020-058453

(51) Int. Cl.
*H01S 5/10*  (2021.01)
*H01S 5/026*  (2006.01)
*H01S 5/042*  (2006.01)

(52) U.S. Cl.
CPC ............ *H01S 5/1003* (2013.01); *H01S 5/026* (2013.01); *H01S 5/04256* (2019.08)

(58) Field of Classification Search
CPC .... H01S 5/1003; H01S 5/1017; H01S 5/1039; H01S 5/0653–0655; H01S 5/22–2277; H01S 2301/16; H01S 2301/166
See application file for complete search history.

(56) References Cited

U.S. PATENT DOCUMENTS

2001/0014109 A1  8/2001  Hamamoto
2002/0181529 A1  12/2002  Tamanoto
(Continued)

OTHER PUBLICATIONS

Shigehisa Arai et. al., "Dynamic-Single-Mode(DSM) Laser and Its Dymamic Wavelength Shift", Journal of Institute of Electronics, Information and Communication Engineers, vol. J73-C-1, No. 5, pp. 216-225, 1990.

*Primary Examiner* — Tod T Van Roy
*Assistant Examiner* — Delma R Forde
(74) *Attorney, Agent, or Firm* — POSZ LAW GROUP, PLC

(57) ABSTRACT

A semiconductor light emitting element includes an optical waveguide having a first and second waveguide provided with a width that allows propagation of light in a second-order mode or higher and a multimode optical interference waveguide provided with a wider width than the first and second waveguide and arranged at a position therebetween. The semiconductor light emitting element further includes a first optical loss layer facing the first waveguide in an active-layer crossing direction for causing a loss of light that is propagating in the first waveguide in the second-order mode or higher and a second optical loss layer facing the second waveguide in an active-layer crossing direction for causing a loss of light that is propagating in the second waveguide in the second-order mode or higher, the active-layer crossing direction being orthogonal to a surface of an active layer.

18 Claims, 7 Drawing Sheets

(56) References Cited

U.S. PATENT DOCUMENTS

| | | | |
|---|---|---|---|
| 2004/0140476 A1 | 7/2004 | Hamamoto | |
| 2004/0245537 A1* | 12/2004 | Kawakami | H01S 5/32341 |
| | | | 257/95 |
| 2007/0258495 A1 | 11/2007 | Hamamoto et al. | |
| 2010/0124245 A1* | 5/2010 | Kobayashi | B82Y 20/00 |
| | | | 257/E21.158 |
| 2011/0176568 A1* | 7/2011 | Satoh | H01S 5/0655 |
| | | | 372/44.01 |
| 2018/0123317 A1* | 5/2018 | Kanskar | H01S 5/2022 |

* cited by examiner

FIG. 5
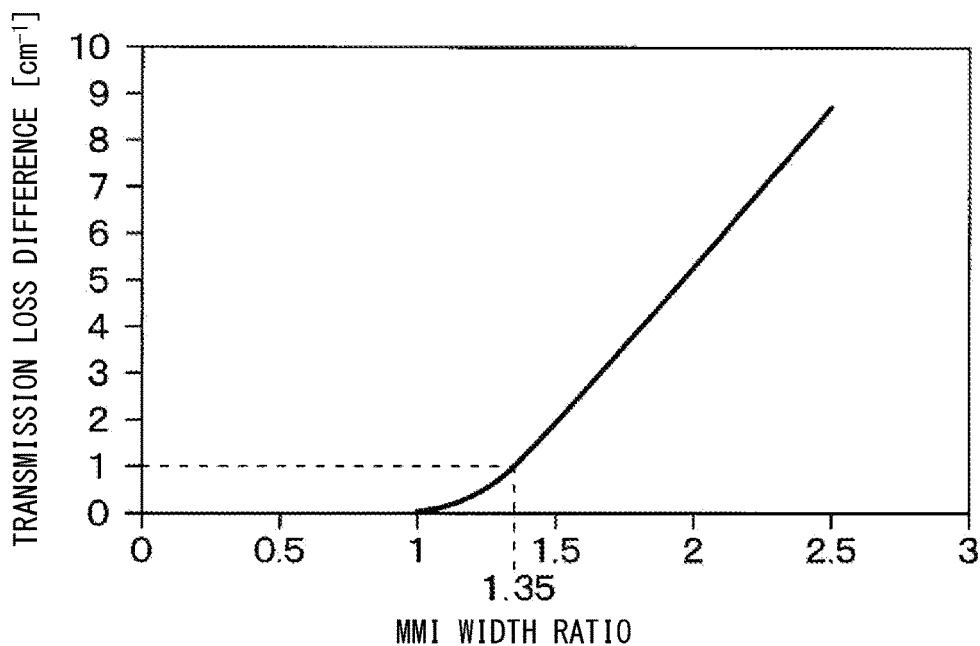
FIG. 6
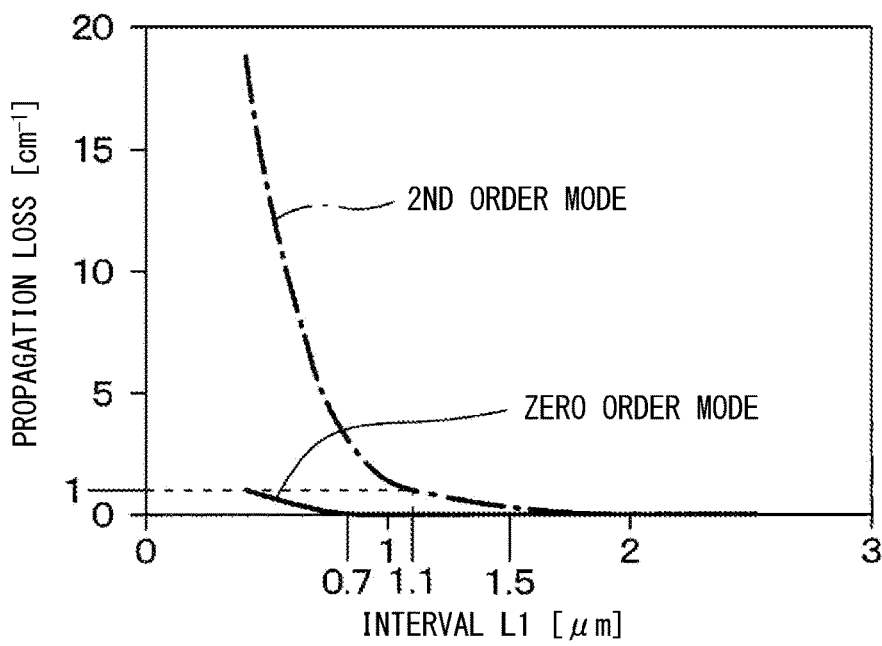
FIG. 7
| STRUCTURE | AREA SIZE | LOSS BY LEAKAGE |
|---|---|---|
| CONVENTIONAL DEVICE | 5800 um$^2$ | 0.44 cm$^{-1}$ |
| DEVICE OF 1ST EMBODIMENT | 7200 um$^2$ | 0.37 cm$^{-1}$ |

SEMICONDUCTOR LIGHT EMITTING ELEMENT

CROSS REFERENCE TO RELATED APPLICATION

The present application is based on and claims the benefit of priority of Japanese Patent Application No. 2020-058453, filed on Mar. 27, 2020, the disclosure of which is incorporated herein by reference.

TECHNICAL FIELD

The present disclosure generally relates to a semiconductor light emitting element having waveguides of different widths.

BACKGROUND INFORMATION

Conventionally, semiconductor light emitting elements having different width waveguides have been proposed. Specifically, such semiconductor light emitting element includes a first waveguide and a second waveguide, and a widened multimode optical interference waveguide, which is arranged at a position between the first waveguide and the second waveguide and is wider than the first and second waveguides. The width of the first waveguide and the second waveguide is set to allow up to the first-order mode as the light propagation mode.

SUMMARY

It is an object of the present disclosure to provide a semiconductor light emitting element capable of reducing power consumption and increasing the output of laser light while outputting single-mode laser light.

BRIEF DESCRIPTION OF THE DRAWINGS

Objects, features, and advantages of the present disclosure will become more apparent from the following detailed description made with reference to the accompanying drawings, in which:

FIG. 5 is a diagram showing simulation result regarding a relationship between an MMI width ratio and a transmission loss difference;

FIG. 6 is a diagram showing a simulation result regarding a relationship between (i) an interval between the first waveguide and the first optical loss layer in an active-layer crossing direction across a surface of an active layer and (ii) a propagation loss in the active-layer crossing direction across a surface of the active layer;

FIG. 7 is a diagram showing a relationship between an area size and a loss by leakage regarding the semiconductor light emitting element according to the first embodiment and a conventional semiconductor light emitting element;

DETAILED DESCRIPTION

Figure 1:
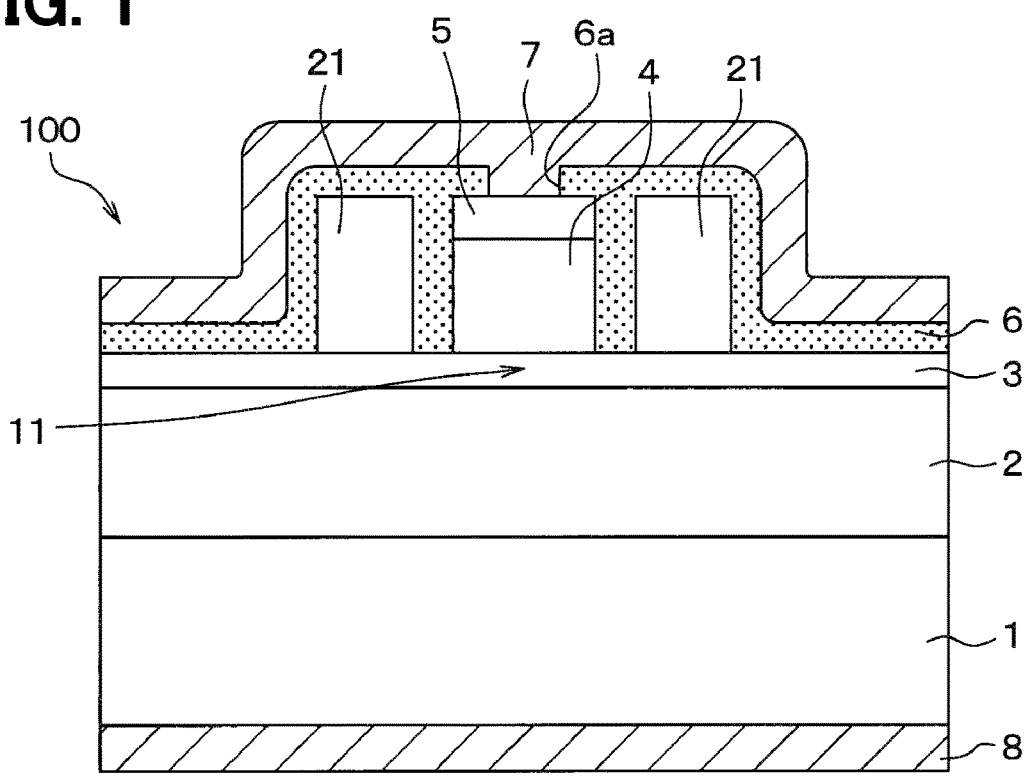
FIG. 1 is a cross-sectional view of a semiconductor light emitting element in a first embodiment.

Hereinafter, embodiments of the present disclosure are described with reference to the drawings. In the following embodiments, the same reference numerals are assigned to parts that are the same or equivalent to each other to describe the same.

(First embodiment, FIGS. 1-7)

Figure 2:
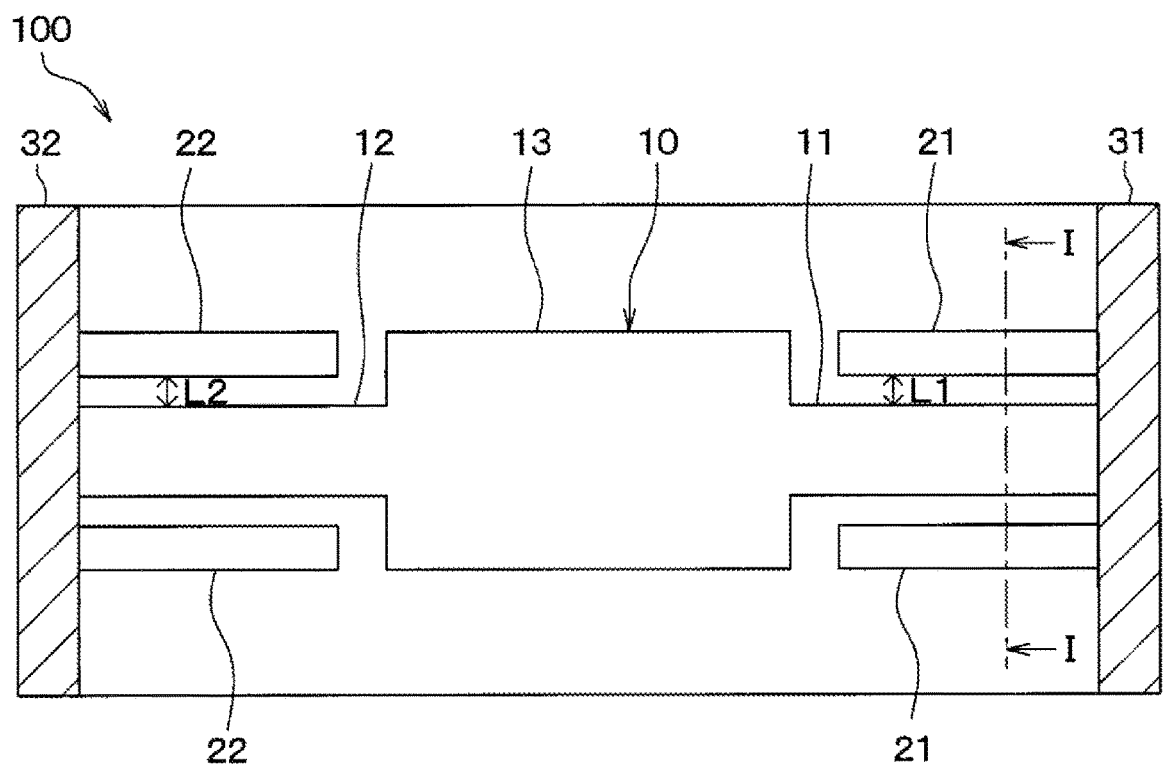
FIG. 2 is a schematic plan view of the semiconductor light emitting element shown in FIG. 1.

A semiconductor light emitting element 100 according to the first embodiment is described with reference to the drawings. In the present embodiment, a semiconductor laser is described as an example of the semiconductor light emitting element 100. As shown in FIG. 1, the semiconductor light emitting element 100 includes a substrate 1 made of n-type GaAs (gallium arsenide), InP (indium phosphide), or the like. A first clad layer 2 made of n-type AlGaAs (aluminum gallium arsenide) or the like is arranged on the substrate 1. On the first clad layer 2, an active layer 3 having a higher refractive index than the first clad layer 2, a second clad layer 4 described later, and an insulating film 6 is arranged. Conventionally, semiconductor devices are described as layers being stacked in a vertical direction. For example, FIG. 1 the legend in FIG. 1 defines three directions. The Z-axis is a vertical axis, and the positive Z direction is up or upwards as shown in FIG. 1. The X-axis is a lateral axis (or a width axis), and the positive X direction is rightwards as shown in FIG. 1. The Y-axis is a longitudinal axis (or a length axis), and the positive Y direction is into the page. Note that FIG. 1 is a cross-sectional view of the line I-I in FIG. 2. In FIG. 2, the longitudinal Y-axis is shown, and defined as forwards. These directions are consistent with common manufacturing techniques, wherein layers are vertically built/stacked one at a time on top of a substrate.

To summarize:

the positive Z-axis (a vertical axis) is defined as upward, and used to measure heights;

the positive X-axis (a lateral axis) is defined as rightward, and used to measure widths; and the positive Y-axis (a longitudinal axis) is defined as forward or frontward, and used to measure lengths.

A second clad layer 4 made of p-type AlGaAs or the like is arranged on the active layer 3. The second clad layer 4 is not arranged on the entire surface of the active layer 3, but is arranged on the active layer 3 only partially. In the present embodiment, the second clad layer 4 extends on the active layer 3 in one direction along a surface of the substrate 1, which may be designated as a longitudinal direction of the second clad layer 4. Then, in such a semiconductor light emitting element 100, an optical waveguide 10 is provided at a portion where the first clad layer 2, the active layer 3, and the second clad layer 4 are layered. That is, the optical waveguide 10 of the present embodiment is configured so that the longitudinal direction of the second clad layer 4 is the longitudinal direction of the optical waveguide 10. Alternatively, directions in the first embodiment may be described as viewed in FIG. 1, including: a lower electrode 8 shown extending laterally from left to right and having a vertical height; a substrate 1 stacked on top of the lower electrode 8 in an upwards vertical direction; a first clad layer stacked on top of the substrate 1, and so forth.

Here, in the optical waveguide 10 of the present embodiment, the width of the second clad layer 4 is adjusted, so that, as shown in FIG. 2, a first waveguide 11 and a second waveguide 12 and a multimode optical interference waveguide (hereinafter, may also simply be referred to as MMI) 13 having a width wider than that of the waveguide 11 and the second waveguide 12 are provided.

The width here is a length in a direction orthogonal to the direction along the longitudinal direction of the optical waveguide 10, and is representing a length in a direction along a surface of the substrate 1. In other words, the width is a length in the direction orthogonal to the longitudinal direction of the optical waveguide 10, and is a length in the direction orthogonal to a stacking direction of the substrate 1, the first clad layer 2, the active layer 3, and the second clad layer 4. That is, in FIG. 2, a length in a vertical direction of the paper surface is the width. Further, though FIG. 1 is a cross-sectional view taken along a line I-I in FIG. 2, FIG. 1 may also illustrate a cross-sectional configuration including the second waveguide 12 which is substantially same as the first waveguide 11. Although not shown in particular, the cross-sectional structure including the MMI 13 is the same as that of FIG. 1 except that the width of the second clad layer 4 is different and a first optical loss layer 21 described later is not arranged.

Figure 3:
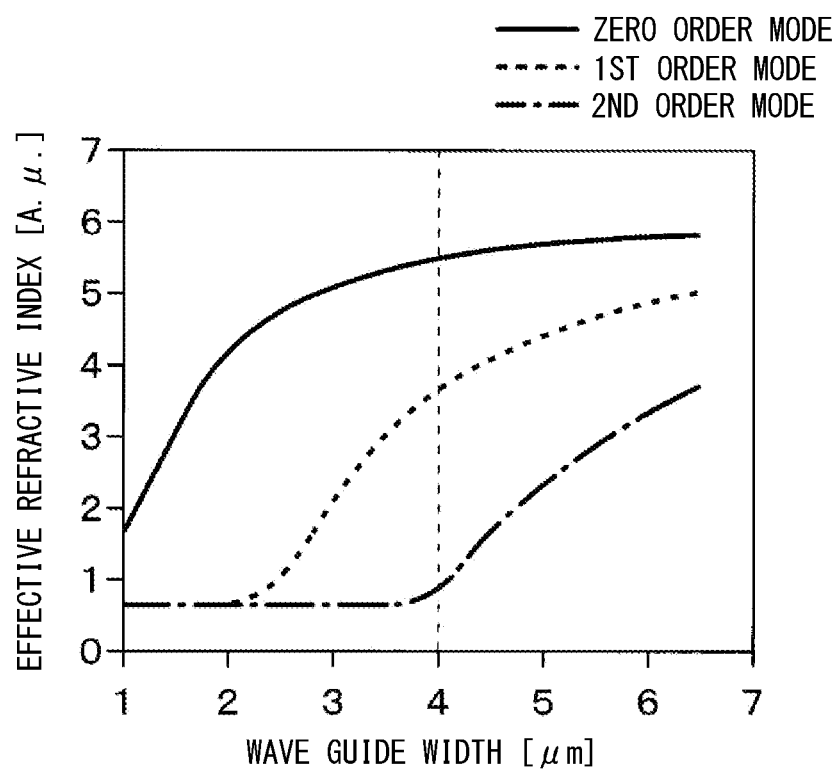
FIG. 3 is a diagram for explaining a relationship between an effective refractive index and a waveguide width.

The first waveguide 11 and the second waveguide 12 are arranged so as to sandwich the MMI 13. That is, the MMI 13 of the present embodiment is a 1-input and 1-output type 1×1-MMI 13. Further, the width of the first waveguide 11 and the second waveguide 12 is set to a length that allows the propagation of light in the second-order mode or higher. The specific operation of the semiconductor light emitting element 100 in the present embodiment is described later, but as shown in FIG. 3, when the optical waveguide 10 is configured as described above, the light in the second-order mode can also be propagated when the waveguide width is 4 μm or more. Therefore, the first waveguide 11 and the second waveguide 12 are set to (i.e., are configured to have a width of) 4 μm or more, and, in the present embodiment, they are set to 6 μm.

As described above, the MMI 13 has a width wider than that of the first waveguide 11 and the second waveguide 12, that is, the width thereof is set to 10 μm in the present embodiment. In the present embodiment, as is described in detail later, the ratio of the width of the MMI 13 to the width of the first waveguide 11 and the second waveguide 12 (hereinafter, also simply referred to as the MMI width ratio) is 1.35 or more. The ratio of the width of the MMI 13 to the width of the first waveguide 11 may be represented as a fraction of the width of the MMI 13/the width of the first waveguide 11. The ratio of the width of the MMI 13 to the width of the second waveguide 12 may be represented as a fraction of the width of the MMI 13/the width of the second waveguide 12. Further, the length of the MMI 13 in the direction orthogonal to the width/lateral direction (hereinafter, also referred to as the length in the longitudinal direction of the MMI 13) is set to 300 μm in the present embodiment.

The total length of the optical waveguide 10 in the longitudinal direction (that is, the cavity length) is 1000 μm in the present embodiment. That is, the sum of the lengths of the first waveguide 11 and the second waveguide 12 in the optical waveguide 10 in the longitudinal direction is 700 μm. In summary, the optical waveguide 10 is 1000 μm total length, and includes: the 350 μm long first optical loss layer 21; the 300 μm long MMI; and the 350 μm long second optical loss layer 22.

As shown in FIG. 1, a cap layer 5 is made of p-type GaAs or the like and is formed on a top surface of the second clad layer 4.

Further, the first optical loss layer 21 and the second optical loss layer 22 are arranged on top of separate portions of the active layer 3. As shown in FIG. 2, two first optical loss layers 21 are provided, which are arranged to sandwich the first waveguide 11 (e.g., in a lateral direction) while facing the first waveguide 11 in an active-layer crossing direction that is orthogonal to a surface of the active layer 3, or while being stacked on top of the active layer 3. Two second optical loss layers 22 are provided, which are arranged so as to sandwich (e.g., in a lateral direction) the second waveguide 12 while being stacked on top of the active layer 3. When described differently, the two second optical loss layers 22 are provided, which are arranged so as to sandwich (e.g., in a lateral direction) the second waveguide 12 while facing the second waveguide 12 in the crossing direction. In other words, the crossing direction may also be describable as seen from a stacking direction of the first clad layer 2, the active layer 3, and the second clad layer 4, or may also be considered as a direction of a straight line that intersects with a plane/surface on which the first waveguide 11, the second waveguide 12, and the MMI 13 are arranged.

Further, in the present embodiment, the first optical loss layer 21 and the second optical loss layer 22 are configured to have the same height as a stack having a combined height of the second clad layer 4 and the cap layer 5 on the active layer 3, as shown in FIG. 1. The width of each of the first optical loss layer 21 and the second optical loss layer 22 is 5 μm.

Further, the insulating film 6 composed of an oxide film or the like is arranged so as to cover the second clad layer 4, the cap layer 5, the first optical loss layer 21 and the second optical loss layer 22. Note that the insulating film 6 is arranged to fill in a portion between (i) the second clad layer 4 and the cap layer 5 and (ii) the first optical loss layer 21 or the second optical loss layer 22. Then, the insulating film 6 is provided with a contact hole 6a exposing a predetermined region of the cap layer 5. An upper electrode 7 that is electrically connected to the second clad layer 4 by being electrically connected to the cap layer 5 via the contact hole 6a is arranged on the insulating film 6. Further, on a back surface side of the substrate 1 opposite to the first clad layer 2, a lower electrode 8 electrically connected to the first clad layer 2 via the substrate 1 is arranged.

When described differently, the insulating film 6 is arranged to cover: part of the top of the active layer 3; the sides and the top of each of the first optical loss layers 21; the sides of the second clad layer 4; the sides of the cap layer 5; and part of the top of the cap layer 5. A contact hole 6a in the insulating film 6 permits the upper electrode 7 to penetrate the contact hole 6a and to contact a central part of the cap layer 5, such that the upper electrode is electrically connected (e.g., vertically downward) to: the cap layer 5; the second clad layer 4, the active layer 3, the first clad layer 2, the substrate 1; and the lower electrode 8. The contact hole 6a may be shaped like a slot (or trench) extending longitudinally across the optical waveguide 10.

Here, in the present embodiment, the first optical loss layer 21 is has a refractive index higher than that the insulating film 6 (i.e., a portion sandwiched between the first optical loss layer 21 and the optical waveguide 10). The second optical loss layer 22 has a refractive index higher than the insulating film 6 (i.e., a portion sandwiched between the second optical loss layer 22 and the optical waveguide 10). That is, in the present embodiment, the first optical loss layer 21 and the second optical loss layer 22 are each made of a material having a higher refractive index than the insulating film 6.

Specifically, the first optical loss layer 21 and the second optical loss layer 22 of the present embodiment are arranged on the active layer 3. Therefore, the first optical loss layer 21 and the second optical loss layer 22 are arranged on the active layer 3, and include the same material as the second clad layer 4 having a higher refractive index than the insulating film 6. Note that the refractive index of AlGaAs constituting the second clad layer 4 is about 3.3, and the refractive index of the oxide film forming the insulating film 6 is about 1.44.

As shown in FIG. 1, the following items have the same height (i.e., extending above the active layer 3): the first optical loss layer 21, the second optical loss layer 22, and the stack including the second clad layer 4 and the cap layer 5. Therefore, in the first optical loss layer 21 and the second optical loss layer 22 of the present embodiment, a portion existing at the same height as the second clad layer 4 is made of the same material as the second clad layer 4, and a portion existing at the same height as the cap layer 5 is made of the same material as the cap layer 5.

An interval L1 between the first optical loss layer 21 and the first waveguide 11, and an interval L2 between the second optical loss layer 22 and the second waveguide 12 in the crossing direction (i.e., lateral or width direction) in FIG. 1 are specifically described later.

Further, as shown in FIG. 2, the semiconductor light emitting element 100 has a (e.g., rear face) low-reflection film 31 and a (e.g., front face) high-reflection film 32 arranged on opposite end faces (e.g., rear face and front face) intersecting the longitudinal direction of the optical waveguide 10. Specifically, the low-reflection film 31 is arranged on an end surface (e.g., rear face) serving as a projection surface, and the high-reflection film 32 having a higher reflectance than the low-reflection film is arranged on an end surface (e.g., front face) serving as a reflection surface. In the present embodiment, the first waveguide 11 is arranged on a projection surface side of the MMI 13, and the second waveguide 12 is arranged on a reflection surface side of the MMI 13. Although FIG. 2 is not a cross-sectional view, the low-reflection film 31 and the high-reflection film 32 are hatched for the ease of understanding.

The basic structure of the semiconductor light emitting element according to the present embodiment is as described above. In the present embodiment, the n-type corresponds to a first conductive type, and the p-type corresponds to a second conductive type. Next, a specific arrangement relationship between the first optical loss layer 21 and the second optical loss layer 22 and the first waveguide 11 and the second waveguide 12 is described.

First, the basic operation of the above-mentioned semiconductor element 100 is described. When a voltage is applied between the upper electrode 7 and the lower electrode 8, electrons move from the n-type first clad layer 2 toward the p-type second clad layer 4 while holes move from the p-type second clad layer 4 toward the n-type first clad layer 2. Then, in the semiconductor light emitting element 100, light is generated by the recombination of holes and electrons in the optical waveguide 10. Further, the low-reflection film 31 and the high-reflection film 32 are arranged on the semiconductor light emitting element 100. Therefore, the light generated by the optical waveguide 10 generates stimulated emission while reciprocating (i.e., reflecting) between the low-reflection film 31 and the high-reflection film 32, and is amplified to be output as laser light from the projection surface (i.e., the rear surface of the low reflection film 31).

In such case, the first waveguide 11 and the second waveguide 12 of the present embodiment have a width that allows the propagation of light in the second-order mode or higher. Therefore, in the first waveguide 11 and the second waveguide 12, the light propagates as a zero-order mode, a first-order mode, or a higher-order mode equal to or higher than the second-order mode.

Figure 4A:
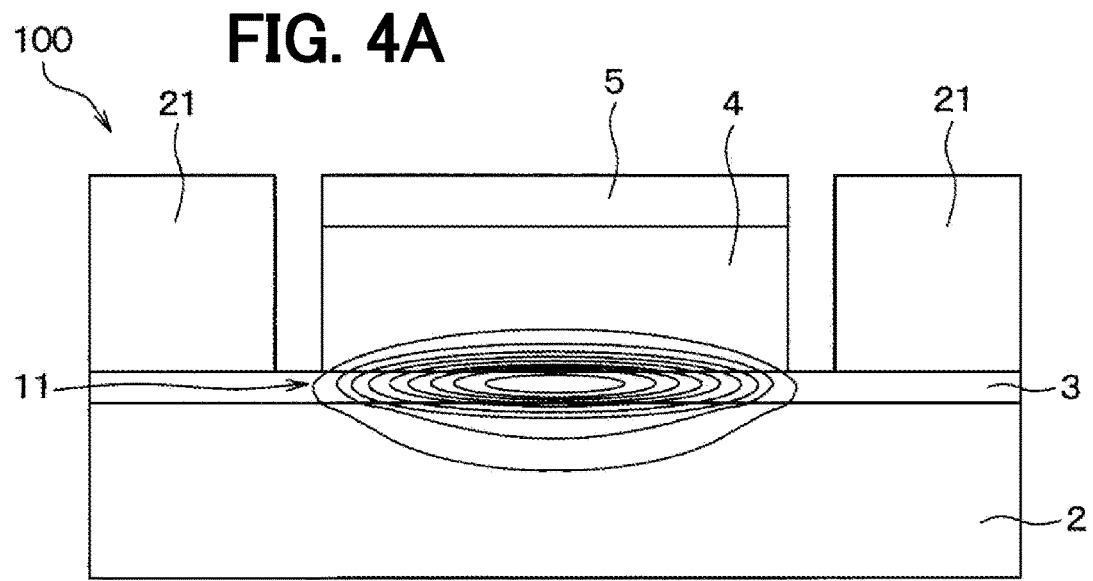
FIG. 4A is a diagram showing a simulation result regarding an electric field when the light propagates in a first waveguide in a zero-order mode.
Figure 4B:
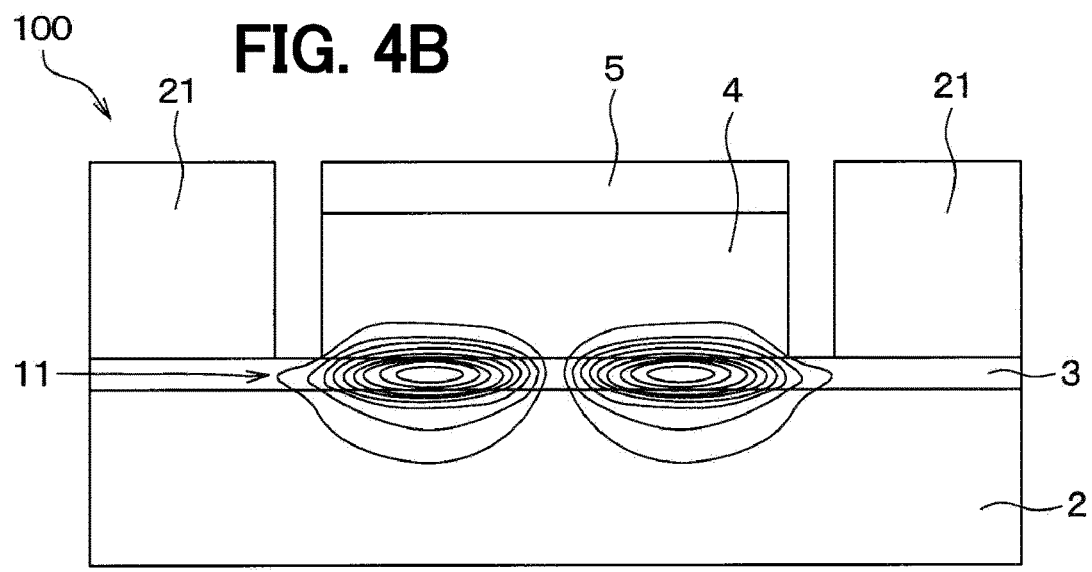
FIG. 4B is a diagram showing a simulation result regarding an electric field when the light propagates in a first waveguide in a first-order mode.
Figure 4C:
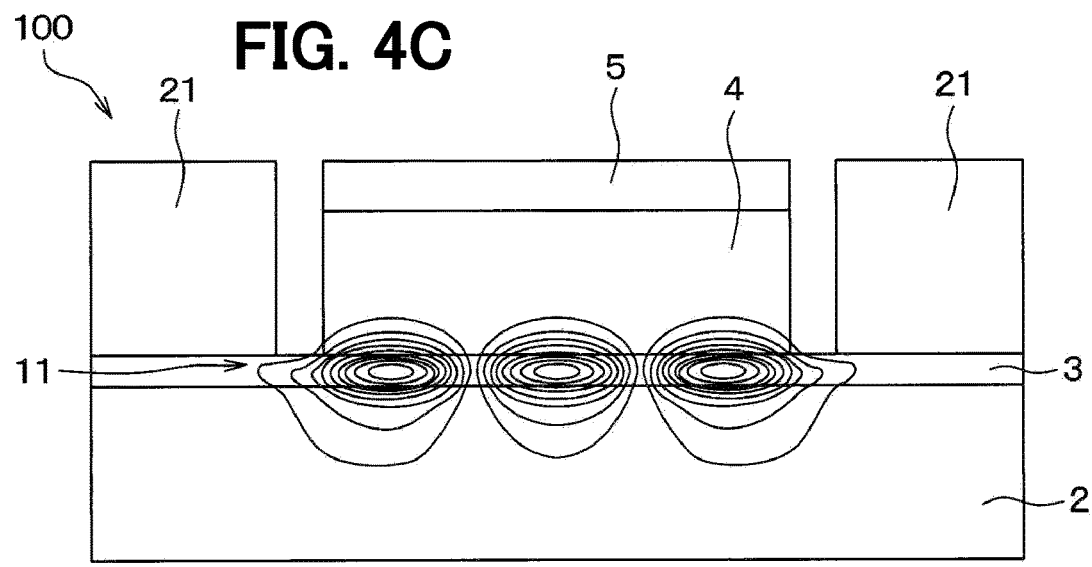
FIG. 4C is a diagram showing a simulation result regarding an electric field when the light propagates in a first waveguide in a second-order mode.

FIGS. 4A to 4C illustrate electric fields when the light propagates through the first waveguide 11 in the zero-order mode, the first-order mode, and the second-order mode. Although not shown, the similar results occur when the light propagates through the second waveguide 12 in the 0th-order mode, the first-order mode, and the second-order mode. Specifically, FIGS. 4A to 4C are diagrams showing simulation results of a portion corresponding to the cross section shown in FIG. 1.

As shown in FIG. 4A, when the light propagates through the first waveguide 11 in the zero-order mode, it is confirmed that the electric field is higher in the central portion of the first waveguide 11. On the other hand, as shown in FIG. 4B, when the light propagates through the first waveguide 11 in the first-order mode, it is confirmed that high parts of the electric field are formed on both ends in the width/lateral direction of the first waveguide 11. Then, as shown in FIG. 4C, when the light propagates in the first waveguide 11 in the second-order mode, it is confirmed that high parts of the electric field are formed at positions further closer to both ends the width/lateral direction of the first waveguide 11 as compared with the case where the light propagates in the first-order mode.

Although not shown in the drawing, when the light propagates through the first waveguide 11 in a mode equal to or higher than the third-order mode, the electric field is similarly formed to be higher on both ends (i.e., the left end and the right end) in the width/lateral direction of the first waveguide 11. However, when the light propagates in the third-order mode or higher, high parts of the electric field are further configured to be closer toward both ends in the width/lateral direction of the first waveguide 11, as compared with the case where the light propagates in the second-order mode.

Further, as shown in FIGS. 4A to 4C, it is confirmed that the electric field spreads in the width/lateral direction to be wider than the width of the first waveguide 11 (e.g., wider than 6 μm in the above discussed example). Then, it is confirmed that spread of the electric field is further increased in width as the mode in which the light propagates becomes larger. That is, in other words, the electric field spreads in the width/lateral direction in proportion to the order number, i.e., as the number (of the order mode) increases from zero-order, first-order, second-order and the like. Although not shown in the drawing, when the light propagates through the first waveguide 11 in the third-order mode or higher, the electric field spreads in the width/lateral direction as the mode increases.

Then, in the present embodiment, as discussed above, the first optical loss layer 21 having a high refractive index (e.g., higher than the 1.44 refractive index of the insulating film) is arranged so as to sandwich the first waveguide 11 in the crossing (i.e., lateral/width) direction. Therefore, by arranging the first optical loss layer 21 so that the light propagating in the first waveguide 11 in the second-order mode or higher is absorbed by the first optical loss layer 21, loss of the light propagating at least in the second-order mode is made increased. Similarly loss of light propagating in high order modes (i.e., third order mode and/or greater) is increased.

Here, first, the light propagating in the first waveguide 11 and the second waveguide 12 in the first-order mode causes a transmission loss in the MMI 13. Specifically, as shown in FIG. 5, when the MMI width ratio (i.e., width of MMI 13 divided by width of first optical loss layer 21) is greater than 1, the transmission loss of the light propagating in the first-order mode becomes large, and a difference of the transmission losses of the light propagating in the zero-order mode and the light propagating in the first-order mode (i.e., first-order mode transmission loss minus zero order mode transmission loss) starts to increase. Then, according to the study/observation by the applicant of the present disclosure, it is confirmed that, when the MMI width ratio is 1.35 or more, the transmission loss difference becomes 1 cm$^{-1}$. Note that the transmission loss difference in FIG. 5 is a value obtained by calculating the transmission loss of the light propagating in the first-order mode minus the transmission loss of the light propagating in the zero-order mode. In other words, (first order loss/cm)−(zero order loss/cm). Further, FIG. 5 is a simulation result using the semiconductor light emitting element 100 which does not have the first optical loss layer 21 and the second optical loss layer 22.

Therefore, in the present embodiment, the MMI width ratio is 1.35 or more. As a result, the light propagating in the first waveguide 11 in the first-order mode becomes difficult to pass through the MMI 13, and the light propagating in the first waveguide 11 and the second waveguide 12 is dominant in the zero-order mode rather than the first-order mode. That is, the light in such case propagates primarily in the zero-order mode. The effects of setting the transmission loss difference to 1 cm$^{-1}$ are described later.

In addition, the applicant of the present disclosure also conducted a detailed study on the (e.g., lateral) interval L1 between the first optical loss layer 21 and the first waveguide 11, and obtained the results shown in FIG. 6. The same applies to the interval L2 between the second optical loss layer 22 and the second waveguide 12. Further, FIG. 6 is a diagram showing a simulation result when the width of the first waveguide 11 is 6 −m as described above.

That is, as shown in FIG. 6, a propagation loss of the light propagating in the second-order mode becomes greater when the interval L1 between the first waveguide 11 and the first optical loss layer 21 is made narrower, since absorption of the light in the second-order mode or higher by the first optical loss layer 21 becomes larger. In such case, in the semiconductor light emitting element 100, it is confirmed that the propagation loss in the second-order mode becomes greater than the propagation loss in the zero-order mode when the interval L1 is 1.5 −m or less. Then, when the interval L1 is less than 1.1 −m, it is confirmed that the difference between the propagation loss in the second-order mode and the propagation loss in the zero-order mode is greater than 1 cm$^{-1}$. Therefore, in the present embodiment, the interval L1 and the interval L2 are set to 1.5 −m or less.

Here, in the literature such as "Journal of the Institute of Electronics, Information and Communication Engineers C-1, Vol, J73-C-1 NO.5, pp.216-225," it has been reported that, when a gain difference of light in different modes is 1 cm$^{-1}$ or more, a laser light based on a mode of light with a smaller loss can be output stably. Note that the gain difference is a value obtained by subtracting the loss difference from the gain difference caused by the material constituting the waveguide. Further, in the present embodiment, since the first and second waveguides 11, 12 and the MMI 13 are made of the same material, the gain difference here (i.e., mentioned above) is a loss difference.

Therefore, in the present embodiment, as described above, the MMI width ratio is set to 1.35 or more. Further, the interval L1 and the interval L2 are set to 1.1 −m or less. As a result, the laser light based on the light in the zero-order mode can be stably output.

However, among the transmission loss of the light propagating in the zero-order mode and the transmission loss of the light propagating in the first-order mode, the transmission loss of the light propagating in the first-order mode becomes greater than the other when the MMI width ratio is greater than 1. Further, when the MMI width ratio is greater than 1, the light in the zero-order mode becomes dominant, which makes it possible to output a single-mode laser light based on the light in the zero-order mode. Therefore, the MMI width ratio may be set to a value at least greater than 1.

Similarly, among the propagation loss of the light propagating in the zero-order mode and the propagation loss of the light propagating in the second-order mode, the propagation loss of the light propagating in the second-order mode becomes greater than the other when the interval L1 and the interval L2 are both 1.5 μm or less. Further, when the interval L1 and the interval L2 are both 1.5 μm or less, the light in the zero-order mode becomes dominant, which makes it possible to output the single-mode laser light based on the light in the zero-order mode. Therefore, the interval L1 and the interval L2 may be set to a value at least 1.5 μm or less.

Further, as shown in FIG. 4A, the electric field spreads in the width/lateral direction as compared with the first waveguide 11 even when the light propagates in the first waveguide 11 as the zero-order mode. Then, as shown in FIG. 6, if the interval L1 is made too short, the light propagating in the zero-order mode in the first waveguide 11 is also absorbed by the first optical loss layer 21. That is, in other words, if the interval L1 is made too short, the propagation loss of the light in the zero-order mode also increases. Therefore, the first optical loss layer 21 and the second optical loss layer 22 are preferably arranged at positions where it is difficult to absorb the light in the zero-order mode, i.e., the interval L1 and the interval L2 may be preferably set to a value of 0.7 μm or more. In other words, 0.7 μm≤L1≤1.1 μm for this example.

As described above, in the present embodiment, the first waveguide 11 and the second waveguide 12 respectively have a width that allows the propagation of light in the second-order mode or higher, i.e., the width of the waveguides 11 and 12 are wider/greater than the case where the first waveguide 11 and the second waveguide 12 allow the light up to the first-order mode. Then, by arranging the first optical loss layer 21 and the second optical loss layer 22 to cause loss of light in the second-order mode or higher, the dominant mode of the light propagating in the first waveguide 11 and the second waveguide 12 is configured as the zero-order mode. Therefore, the area size of the optical waveguide 10 can be increased while outputting the single-mode laser light based on the zero-order mode light. Therefore, according to the semiconductor light emitting element 100 of the present embodiment, it is possible to reduce the power consumption and increase the output of the laser light while outputting the single mode laser light.

In FIG. 7, for example, in the semiconductor light emitting element 100 of the present embodiment, as described above, the optical waveguide 10 has a cavity length of 1000 μm, a length of the MMI 13 in the longitudinal direction of 300 μm, and a total length of the first waveguide 11 and the second waveguide 12 in the longitudinal direction is 700 −m. Further, the width of the MMI 13 is 10 μm, and the width of the first waveguide 11 and the second waveguide 12 is 6 μm. Therefore, in the semiconductor light emitting element 100 of the present embodiment, as shown in FIG. 7, the area size of the optical waveguide 10 is 7200 μm². On the other hand, a conventional semiconductor light emitting element (hereinafter, may simply be referred to a conventional element) which has, as a width of the waveguides 11 and 12 for enabling propagation of the light in the first-order mode, the width of the first waveguide 11 and the second waveguide 12 being set to 4 μm, i.e., to a length at which the light in the second-order mode starts to be generated, the area size of the optical waveguide 10 is 5800 μm2. That is, the area size of the semiconductor light emitting element 100 of the present embodiment is increasable.

In such case, in the conventional semiconductor light emitting element, the loss by leakage is 0.44/cm. On the other hand, in the semiconductor light emitting element 100 of the present embodiment, since the area size of the optical waveguide 10 is increasable, the light confinement property can be improved and the loss by leakage is to 0.37/cm. Therefore, according to the semiconductor light emitting element 100 of the present embodiment, it is possible to reduce the power consumption and increase the output of the laser light.

Further, in the present embodiment, the first waveguide 11 and the second waveguide 12 are arranged on the active layer 3 and include the same material as the second clad layer 4. Therefore, the first waveguide 11 and the second waveguide 12 can be formed at the same time when the second clad layer 4 is formed, and the manufacturing process is made simpler.

Further, in the present embodiment, the ratio of (i) the width of the MMI 13 to (ii) the width of the first waveguide 11 and the second waveguide 12 is 1.35 or more. Therefore, the light in the first-order mode propagating in the first waveguide 11 and the second waveguide 12 is less likely to pass through the MMI 13, and the light in the zero-order mode is made dominant. Therefore, output of the single mode laser light based on the zero-order mode light is further made easier.

Figure 8:
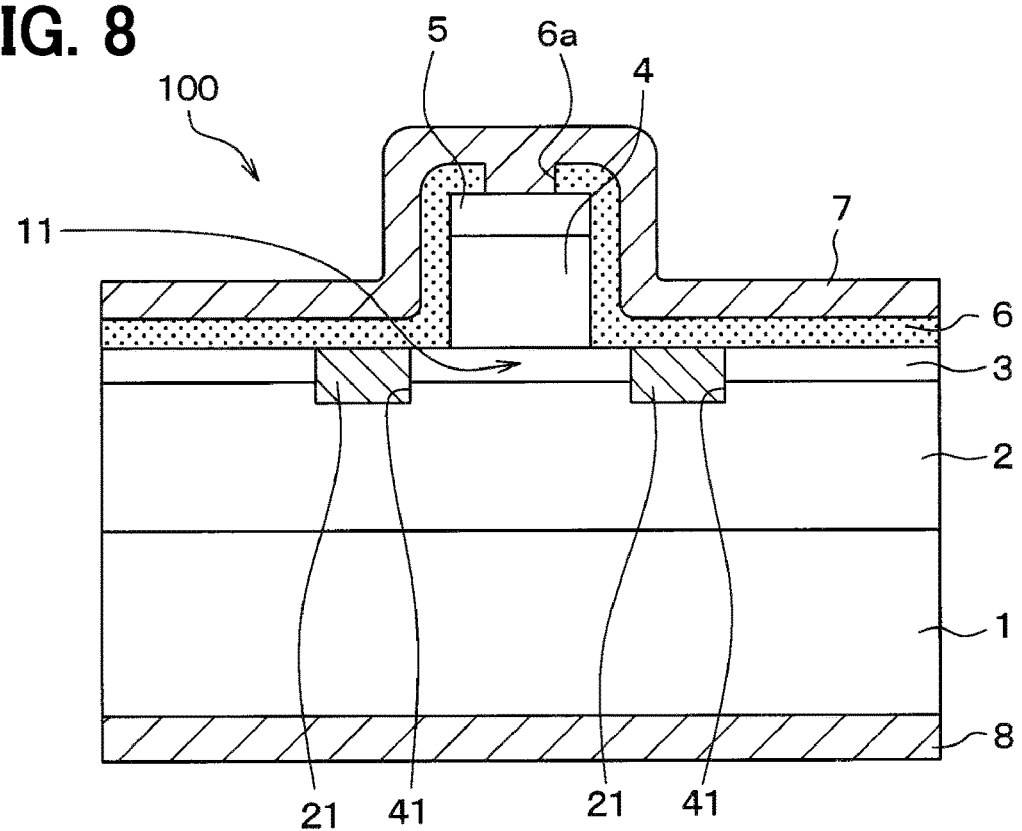
FIG. 8 is a cross-sectional view of the semiconductor device in a second embodiment.

(Second embodiment, FIG. 8)

The second embodiment of the present disclosure is described herein. In the present embodiment, the positions where the first optical loss layer 21 and the second optical loss layer 22 are arranged are changed from the first embodiment. The remaining configuration is similar to that according to the first embodiment and will thus not be described repeatedly.

In the semiconductor light emitting element 100 of the present embodiment, as shown in FIG. 8, a recess 41 is formed from a portion of the active layer 3 different from a part serving as the first waveguide 11 into the first clad layer 2. The recess 41 is formed to sandwich the first waveguide 11 in the crossing direction.

The first optical loss layer 21 is arranged to fill the recess 41. That is, the first optical loss layer 21 of the present embodiment is arranged so that a part thereof is positioned in the active layer 3. Further, the first optical loss layer 21 of the present embodiment is made of a metal such as aluminum which is a conductor.

Note that FIG. 8 corresponds to a cross-sectional view taken along the line I-I in FIG. 2. Further, although not shown, the second optical loss layer 22 is arranged in the recess 41 formed to sandwich the second waveguide 12 in the crossing direction, just like the first optical loss layer 21, while, just like the first optical loss layer 21, it is made of metal.

Such a structure also makes it possible to yield the similar advantageous effects as those in the first embodiment described above. Further, as shown in FIGS. 4A to 4C referred to in the first embodiment, the electric field is configured to spread around the active layer 3 constituting the first waveguide 11, which is, in this case, more widely spread toward the first clad layer 2 than toward the second clad layer 4. Therefore, by arranging the first optical loss layer 21 and the second optical loss layer 22 in the portion including the active layer 3, in comparison to a case where the first optical loss layer 21 and the second optical loss layer 22 are arranged on the active layer 3, the loss of the light propagating in the second-order mode easily increasable.

Note that, in the present embodiment, the first optical loss layer 21 and the second optical loss layer 22 are made of metal. Therefore, the light propagating in the first waveguide 11 in the second-order mode or higher is lost by the absorption of the electric field by the first optical loss layer 21. Similarly, the light propagating in the second waveguide 12 in the second-order mode or higher is lost by the absorption of the electric field by the second optical loss layer 22.

Figure 9:
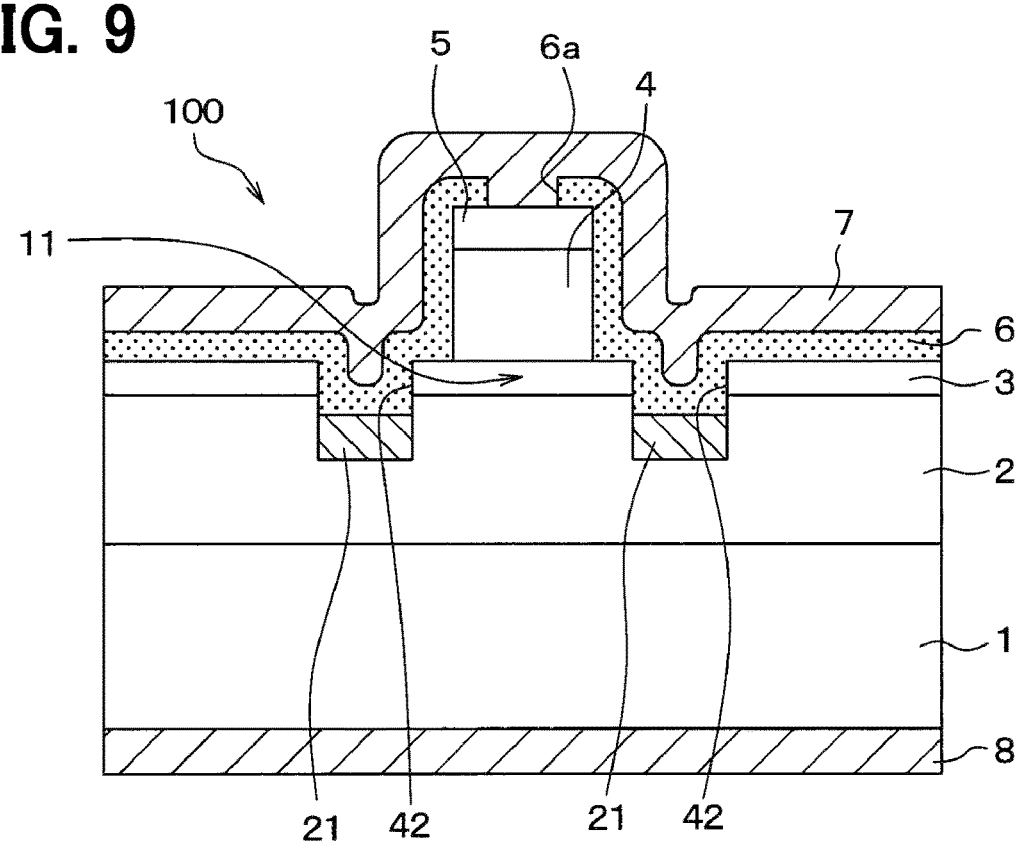
FIG. 9 is a cross-sectional view of the semiconductor device in a third embodiment.

(Third embodiment, FIG. 9)

The third embodiment of the present disclosure is described. In the present embodiment, the positions where the first optical loss layer 21 and the second optical loss layer 22 are arranged are changed from the second embodiment. The remaining configuration is similar to that according to the second embodiment and will thus not be described repeatedly.

In the semiconductor light emitting element 100 of the present embodiment, as shown in FIG. 9, a recess 42 is formed from a portion of the active layer 3 different from a part serving as the first waveguide 11 into the first clad layer 2. The recess 42 is formed to sandwich the first waveguide 11 in the crossing direction. However, the recess 42 is deeper than that of the second embodiment. Specifically, the recess 42 may be described as a left recess 42 leftward (and downward) of the second clad layer 4, and a right recess 42 located rightward (and downward) of the second clad layer 4. The left recess 42 and the right recess 42 sandwich the second clad layer 4 (or, more accurately, sandwich a portion of the active layer 3 located below the second clad layer 4).

The first optical loss layer 21 is arranged on the substrate 1 side of (i.e., located below) the active layer 3 (i.e., at a position deeper than the second embodiment) by being arranged in the recess 42. In the present embodiment, the first optical loss layer 21 is not arranged to completely fill the recess 42, but is arranged in a bottom portion of the recess 42 so that the entire layer 21 is positioned closer to the substrate 1 than (i.e., is below) the active layer 3. The insulating film 6 intrudes into the recess 42, and contacts a top surface of the first optical loss layer 21.

Note that FIG. 9 corresponds to a cross-sectional view taken along the line I-I in FIG. 2. Further, although not shown, the second optical loss layer 22 is arranged in the recess 42 so that the entire second optical loss layer 22 is positioned closer to the substrate 1 than the active layer 3, similar to the first optical loss layer 21.

Such a structure also makes it possible to yield the similar advantageous effects as those in the third embodiment.

Figure 10:
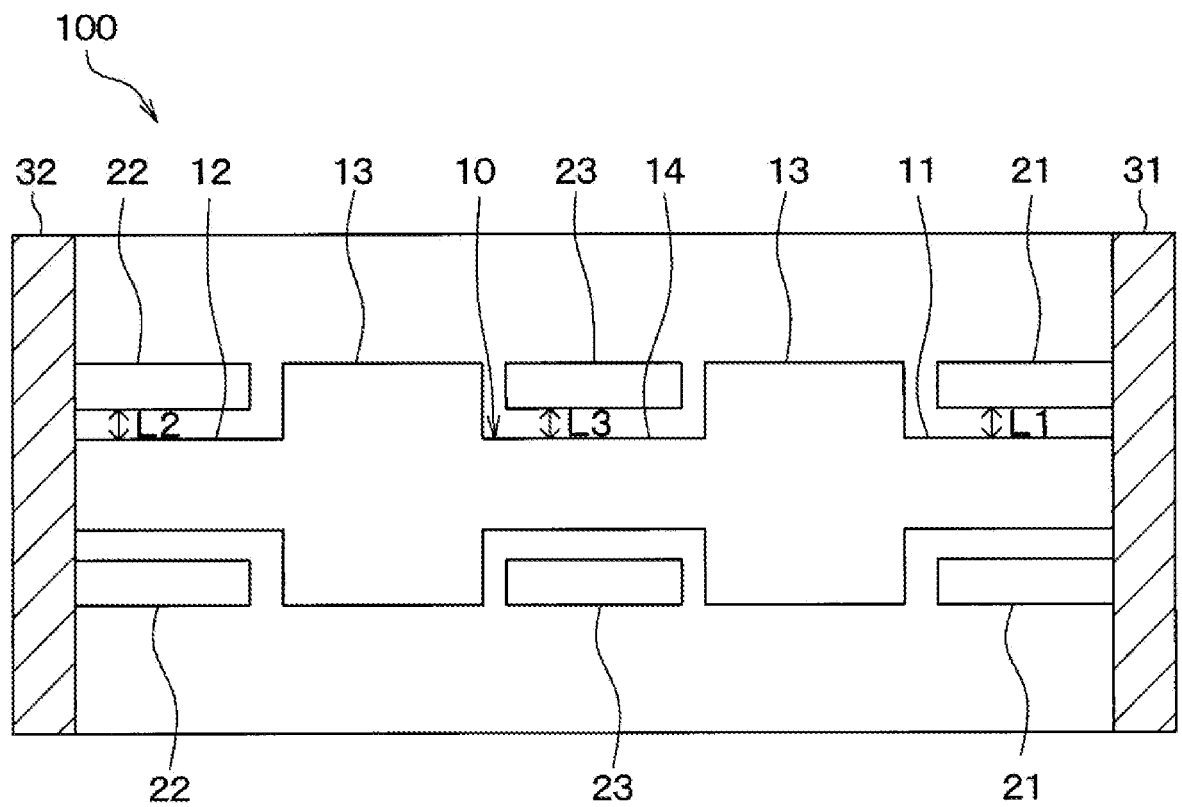
FIG. 10 is a schematic plan view of the semiconductor device according to a fourth embodiment.

(Fourth embodiment, FIG. 10)

The fourth embodiment of the present disclosure is described. In the present embodiment, the configuration of the third interlayer insulation film 53 is different from that of the first embodiment. The remaining configuration is similar to that according to the first embodiment and will thus not be described repeatedly.

In the semiconductor light emitting element 100 of the present embodiment, as shown in FIG. 10, the optical waveguide 10 has a configuration including the first waveguide 11, the second waveguide 12, a third waveguide 14, and two MMIs 13. The third waveguide 14 is arranged at a position between the two MMIs 13. Further, the first waveguide 11 is arranged on the opposite side of the third waveguide 14 with one MMI 13 interposed in between, and the second waveguide 12 is arranged on the opposite side of the third waveguide 14 with the other MMI 13 interposed in between.

The third waveguide 14 has the same configuration as the first waveguide 11 and the second waveguide 12, and has a width capable of propagating the light in the second-order mode or higher, and is 6 μm in width in the present embodiment. Each MMI 13 has a width of 10 μm as in the first embodiment, but has a length of 300 μm in the direction along the longitudinal direction of the optical waveguide 10.

Then, in the semiconductor light emitting element 100 of the present embodiment, the third light loss layer 23 is arranged to sandwich the third waveguide 14 in the crossing direction. The third light loss layer 23 is arranged on the active layer 3 just like the first optical loss layer 21 and the second optical loss layer 22, and includes the same material as the second clad layer 4. Further, regarding the third light loss layer 23, an interval L3 from the third waveguide 14 is set to be equal to (i) the interval L1 between the first optical loss layer 21 and the first waveguide 11, and to (ii) the interval L2 between the second optical loss layer 22 and the second waveguide 12.

Such a structure also makes it possible to yield the similar advantageous effects as those in the third embodiment.

(Modification of fourth embodiment, NO FIGURE)

The modification of the fourth embodiment is described below, but is not shown in a figure. For example, as a modification of the fourth embodiment, a plurality of third waveguides 14 may be provided, and each of the third waveguides 14 may respectively be connected to two MMIs 13. Further, as a modification of the fourth embodiment, the MMI 13 may be provided in a number of three or more, instead of only two. That is, a modification of the fourth embodiment may be configured to include a plurality of N×N–MMI 13 where N is an integer.

Figure 11:
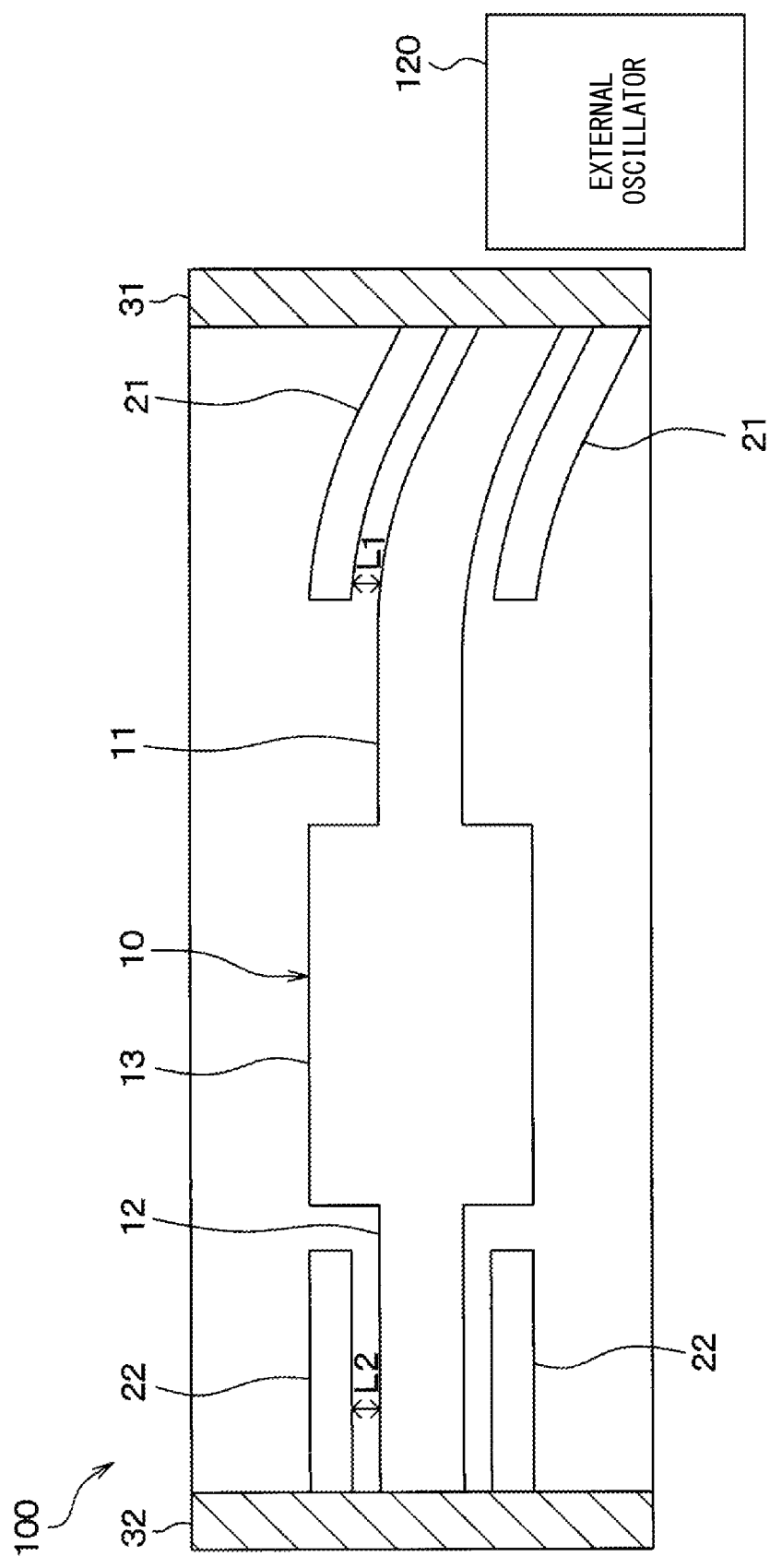
FIG. 11 is a schematic plan view of the semiconductor light emitting element and an external oscillator according to a fifth embodiment.

(Fifth embodiment, FIG. 11)

The fifth embodiment of the present disclosure is described. In the present embodiment, the configuration of the first embodiment is applied to a semiconductor optical amplifier which may serve as the semiconductor light emitting element 100. The remaining configuration is similar to that according to the first embodiment and will thus not be described repeatedly.

As shown in FIG. 11, the semiconductor light emitting element 100 of the present embodiment is provided as a semiconductor optical amplifier, in which the first waveguide 11 is arranged as oblique to the end surface on which the low-reflection film 31 is disposed, and a reflection index between the first waveguide 11 and the low-reflection film 31 is configured to have a low value. Further, an external oscillator 110 is provided in the vicinity of the end surface on which the low-reflection film 31 is disposed at a position where the light output from the first waveguide 11 can be input. As a result, in the present embodiment, the laser light is output by the semiconductor light emitting element 100 and the external oscillator 110.

As described above, even if the semiconductor optical amplifier is configured as the semiconductor light emitting element 100, the same effects as that of the first embodiment are obtainable because the first optical loss layer 21 and the second optical loss layer 22 are arranged.

(Other embodiments)

The present disclosure is not limited to the above-described embodiments and may be appropriately modified.

For example, in each of the above embodiments, the first clad layer 2 may be a p-type material, and the second clad layer 4 and the cap layer 5 may be an n-type material.

Further, in each of the above embodiments, only one first optical loss layer 21 may be provided, which means that the first optical loss layer 21 may be arranged not to sandwich the first waveguide 11 in the crossing direction. Similarly, only one second optical loss layer 22 may be provided, which means that the second optical loss layer 22 may not be arranged to sandwich the second waveguide 12 in the crossing direction.

Further, in a modification of the first embodiment, the height of the first optical loss layer 21 and the second optical loss layer 22 from the active layer 3 may be not the same as (i.e., may be different from) the height of the stack of the second clad layer 4 and the cap layer 5. For example, the height of the first optical loss layer 21 and the second optical loss layer 22 from the active layer 3 may be lower than the height of the stack of the second clad layer 4 and the cap layer 5.

That is, the height of the first optical loss layer 21 and the second optical loss layer 22 can be changed as appropriate.

Further, in a modification of the first embodiment, the width of the first waveguide 11 and the second waveguide 12 does not have to be constant along the longitudinal direction, that is, the first waveguide 11 and the second waveguide 12 may have a narrow/neck portion having a partially narrowed width is formed. It may be configured to have. For example, the first waveguide 11 and the second waveguide 12 may have a narrow portion formed of a tapered portion whose width is gradually narrowed at an end portion in the longitudinal direction. In such case, the narrow portion may have a width that allows only the propagation of the light in the first-order mode or lower, for example.

Further, in the second and third embodiments, the first optical loss layer 21 and the second optical loss layer 22 may be formed by using a material containing the second clad layer 4 instead of metal.

Further, in the second embodiment, the first optical loss layer 21 and the second optical loss layer 22 may have a portion positioned on the active layer 3 if a part of the optical loss layers 21, 22 is arranged in the active layer 3.

Furthermore, the embodiments described above can be combined together as appropriate. For example, the second and third embodiments may be combined with the fourth embodiment to have a plurality of MMIs 13 while changing the arrangement positions of the first and second optical loss layers 21 and 22. Further, the second and third embodiments may be combined with the fifth embodiment to form a semiconductor optical amplifier in which the arrangement positions of the first and second optical loss layers 21 and 22 are changed. Further, the fourth embodiment may be combined with the fifth embodiment to form a semiconductor optical amplifier having a plurality of MMIs 13. Further, combinations of the above embodiments may further be combined.

What is claimed is:

1. A semiconductor light emitting element that outputs laser light, the semiconductor light emitting element comprising:
    a first conductive type first clad layer;
    an active layer arranged on the first clad layer;
    a second conductive type second clad layer arranged on the active layer;
    an upper electrode electrically connected to the second clad layer; and
    a lower electrode electrically connected to the first clad layer, wherein
    a portion where the first clad layer, the active layer, and the second clad layer are layered constitutes an optical waveguide,
    the optical waveguide includes a first waveguide and a second waveguide respectively having widths capable of propagating light in a second-order mode or higher, and a multimode optical interference waveguide arranged between the first and second waveguides and having a width wider than the first and the second waveguides,
    a first optical loss layer is provided to face the first waveguide in an active-layer crossing direction for causing a loss of light that is propagating in the first waveguide in the second-order mode or higher, and a second optical loss layer is provided to face the second waveguide in an active-layer crossing direction for causing a loss of light that is propagating in the second waveguide in the second-order mode or higher, the active-layer crossing direction being a direction orthogonal to a surface of the active layer,
    the first waveguide is not in direct physical contact with the first optical loss layer, and
    the second waveguide is not in direct physical in contact with the second optical loss layer.

2. The semiconductor light emitting element of claim 1, wherein
    the first optical loss layer comprises two first optical loss layers,
    the second optical loss layer comprises two second optical loss layers,
    the two first optical loss layers are arranged to sandwich the first waveguide in the active-layer crossing direction, and
    the two second optical loss layers are arranged to sandwich the second waveguide in the active-layer crossing direction.

3. The semiconductor light emitting element of claim 1, wherein
    the first optical loss layer and the second optical loss layer are respectively arranged on the active layer.

4. The semiconductor light emitting element of claim 1, wherein
    the first optical loss layer and the second optical loss layer are respectively partially arranged in the active layer.

5. The semiconductor light emitting element of claim 1, wherein
    both of the first optical loss layer and the second optical loss layer are positioned closer to the first clad layer than the active layer respectively as their entirety.

6. The semiconductor light emitting element of claim 1, wherein
    the first optical loss layer and the second optical loss layer respectively include a same material as the second clad layer.

7. The semiconductor light emitting element of claim 1, wherein
    the first optical loss layer and the second optical loss layer are both made of metal.

8. The semiconductor light emitting element of claim 1, wherein the first waveguide and the second waveguide respectively have a width of equal to or greater than 4 µm.

9. The semiconductor light emitting element of claim 1, wherein
    an interval between the first optical loss layer and the first waveguide and an interval between the second optical loss layer and the second waveguide are each equal to or smaller than 1.5 µm.

10. The semiconductor light emitting element of claim 9, wherein
    an interval between the first optical loss layer and the first waveguide in the active-layer crossing direction and an interval between the second optical loss layer and the second waveguide in the active-layer crossing direction are respectively equal to or smaller than 1.1 µm.

11. The semiconductor light emitting element of claim 1, wherein
    an interval between the first optical loss layer and the first waveguide in the active-layer crossing direction and an interval between the second optical loss layer and the second waveguide in the active-layer crossing direction are respectively equal to or greater than 0.7 µm.

12. The semiconductor light emitting element of claim 1, wherein
    a ratio of a width of the multimode optical interference waveguide divided by a width of the first waveguide is equal to or greater than 1.35.

13. The semiconductor light emitting element of claim 1 further comprising:
    an additional multimode optical interference waveguide.

14. A semiconductor light emitting element comprising:
    a lower electrode;
    a substrate on a top surface of the lower electrode;
    a first clad layer on a top surface of the substrate;
    an active layer on a top surface of the first clad layer;
    a left first optical loss layer on a left portion of a top surface of the active layer;
    a second clad layer on a center portion of the top surface of the active layer;
    a right first optical loss layer on a right portion of the top surface of the active layer;
    a cap layer on a top surface of the second clad layer;
    an insulating film contacting:
    (i) a first portion of the top surface of the active layer located leftward of the left first optical loss layer,
    (ii) a left side, a top, and a right side of the left first optical loss layer,
    (iii) a second portion of the top surface of the active layer located between the left first optical loss layer and the second clad layer,
    (iv) a left side of the second clad layer,
    (v) a left side of the cap layer,
    (vi) a left side of a top surface of the cap layer, (vii) a right side of the top surface of the cap layer, such that a vertical contact hole in the insulating film extends upwards from a central portion of the top surface of the cap layer,
(viii) a right side of cap layer,
(ix) a right side of the second clad layer,
(x) a third portion of the top surface of the active layer located between the second clad layer and the right first optical loss layer,
(xi) a left side, top, and right side of the right first optical loss layer, and
(xii) a fourth portion of the top surface of the active layer located rightward of the right first optical loss layer; and
an upper electrode covering a top surface of the insulating film, penetrating the contact hole, and contacting the central portion of the top surface of the cap layer.

15. The semiconductor light emitting element of claim 14, further comprising:
a left second optical loss layer;
a right second optical loss layer;
a low reflection film located on a rearward side of the element;
a high reflection film located on a forward side of the element;
a first waveguide extending forward from the low reflection film;
a second waveguide extending rearward from the high reflection film; and
a multi-mode optical interference waveguide (MMI) connecting the first waveguide to the second waveguide,
wherein the first optical loss layers extend forward from the low reflection film, sandwich the first waveguide, and terminate before reaching the MMI,
wherein the second optical loss layers extend rearward from the high reflection film, sandwich the second waveguide, and terminate before reaching the MMI.

16. The semiconductor light emitting element of claim 15, wherein a width of the MMI divided by a width of the right first optical loss layer is ≥1.35.

17. The semiconductor light emitting element of claim 16, wherein an interval designated as L1 located between the right first optical loss layer and the first waveguide satisfies the following equation:
$0.7\ \mathrm{-m} \leq L1 \leq 1.1\ \mu m$.

18. The semiconductor light emitting element of claim 17, wherein a total width from the left side of the left first optical layer to a right side of the right first optical layer is approximately equal to the width of the MMI,
wherein a length of the first waveguide is approximately 350 μm,
wherein a length of the MMI is approximately 300 μm,
wherein a length of the second waveguide is approximately 350 μm,
wherein a width of the left first optical layer is approximately 5 μm,
wherein a width of the second clad layer is approximately 6 μm,
wherein the width of the right first optical layer is approximately 5 μm,
wherein a width of the first waveguide is approximately 5 μm, and
wherein the width of the MMI is approximately 100 μm.

* * * * *